(12) United States Patent
Peter et al.

(10) Patent No.: US 6,418,389 B2
(45) Date of Patent: *Jul. 9, 2002

(54) TEST SYSTEM AND TEST METHOD FOR TESTING THE OPERABILITY OF TEST SAMPLES

(75) Inventors: Winfried Peter, Hohenems; Thomas Hensler, Klaus, both of (AT)

(73) Assignee: Omicron Electronics GmbH, Altach (AT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/194,865
(22) PCT Filed: Mar. 17, 1998
(86) PCT No.: PCT/EP98/01524
  § 371 (c)(1),
  (2), (4) Date: Aug. 2, 1999
(87) PCT Pub. No.: WO98/45720
  PCT Pub. Date: Oct. 15, 1998

(30) Foreign Application Priority Data

Apr. 4, 1997 (DE) .......................................... 197 13 932

(51) Int. Cl.[7] .............................................. G01R 31/28
(52) U.S. Cl. ...................... 702/108; 324/73 R; 702/121
(58) Field of Search ................................ 702/117, 118, 702/108, 123; 714/732; 324/73 R, 158, 76.11, 76.19; 371/22

(56) References Cited

U.S. PATENT DOCUMENTS 4,862,067 A * 8/1989 Brune et al. ............... 324/73 R
5,278,565 A * 1/1994 Horn .......................... 342/165

FOREIGN PATENT DOCUMENTS

EP    0 296 884    12/1988
EP    0 336 656    10/1989
EP    0 508 290 A1    10/1992

OTHER PUBLICATIONS

Hascher, Wolfgang, *PC–Messtechnik: Eine Branche im Boom*, Elecktronik, vol. 43 (1994) May 17, No. 10, Poing, DE, pp. 98, 101–103, Germany.

Wurzburg, *Datenlogger*, Elektrotechnik, vol. 70, No. 22, (1988) Dec. 16, pp. 22–25, Germany.

Kirsop, Douglas, *Signal Switching In Automated Test Equipment*, Machine Design, vol. 60, No. 29, (1988) Dec., pp. 75–80, Cleveland, Ohio, U.S.A.

Gauthier, Francois, *Le Test A Son Atelier Flexible*, Mesures, vol. 58, No. 655, (1993) May, pp. 106–108, France.

Therrien, Earl L., *Wavetest The Total Solution To GPIB Test System Programs*, Electro 1988 Conference Record 13, (1988) May 10–12, Los Angeles, California, U.S.A.

\* cited by examiner

*Primary Examiner*—Kamini Shah
(74) *Attorney, Agent, or Firm*—Kilgannon & Steidl

(57) ABSTRACT

Test system and test method for testing the operability of test samples (7). A selection can be made in a user-specific manner from a plurality of test modules (2a–2c) which are made available, which can be assembled together to a desired test specification. A control module (1) carries out the overall test corresponding to the user-specific test specification, and controls individual selected test modules (2a–2c) in the desired sequence in correspondence to this test specification. Advantageously, there is produced automatically a test report on the test results of the individual selected test modules (2a–2c), which reports in particular embedded in the user-specific test specification.

30 Claims, 8 Drawing Sheets

| FIG.4A |
| FIG.4B |

Differential Operating Characteristic Test Report

Test Result

Test Parameters

| | |
|---|---|
| Test Fault: | C-A |
| Fault Location: | PRIMARY Side |
| Test Method: | Magnitude Variation |
| Nom Characteristic: | Used |

Defined Test Points and Results

| IDiff | IBias | Nom TTime | Act.TTime | Tested | Result | Man.Assessed |
|---|---|---|---|---|---|---|
| | | N/T | | | | |
| | | 0.100 s | | | | |
| 20 I/In | 0.50 I/In | | 0.000 s | no | n/s | no |
| 40 I/In | 0.50 I/In | | 0.000 s | no | n/s | no |

CM Engine NO CMC is connected to PC

For help press F1     NUM     27.03.97    15:54:14

FIG.4B

TEST SYSTEM AND TEST METHOD FOR TESTING THE OPERABILITY OF TEST SAMPLES

FIELD OF THE INVENTION

The present invention relates to a test system and a test method for testing the operability of electrical test samples. In particular the present invention relates to a test systems and a test method for testing the operability of electrical components of energy supply devices.

BACKGROUND OF THE INVENTION

For the testing of electrical test samples, in particular of electrical components of energy supply devices, there are known various kinds of test apparatus or test system. Thereby, in general, the known test systems represent merely individual solutions for particular applications and can merely test certain functions of a few kinds of test samples. Thus, for example in the field of energy supply devices, there are known separate test apparatuses for over-current relays, synchronization devices, energy meters etc.

However, the construction of the electrical test samples to be tested is becoming increasingly more complex. Thus, for example, the test samples may contain a plurality of protection and measurement functions which must correspondingly be separately tested. Such multi-functional test samples cannot be tested in a simple manner with conventional test systems. Rather, for the testing of the individual functions of the test sample, separate test apparatuses must be provided.

Although it is known to test different functions of a test sample with one and the same test system, these individual functions of the test sample must however be tested separately from one another, whereby it is not possible during the testing of one function to access the test results of the other function. In particular, no overall evaluation of the operability of the test sample can be given taking into consideration the test results with regard to all tested functions. The test report generated by the known test systems, which gives the test results of a test, thus contains only information in each case concerning one function test, i.e. the test report relates in each case only to one partial aspect of the overall test.

The assembly of a complex automatic test or check, which tests or checks all functions of a, for example, multi-functional test sample, is not possible without prior programming by the user. This, however, has the consequence that such a complex automatic test cannot be produced without knowledge of programming.

The present invention is thus based upon the object of proposing a test system and a test method for testing the operability of test samples, whereby the above-mentioned problems are removed.

In particular, there is to be proposed a test system and a test method whereby even a complex test of a test sample is ensured with simple means. Further, an overall evaluation of the overall test should be possible with regard to the operability of the test sample.

The above object is achieved with regard to the test system by means of a test system in accordance with claim 1 and with regard to the test method by means of a method according to claim 26.

SUMMARY OF THE INVENTION

The sub-claims describe general advantageous configurations of the invention.

In accordance with the invention, a plurality of different test modules are available, whereby each test module tests a particular test sample with regard to one or more particular functional aspects. The individual test modules can test one and the same test sample or different test samples. The test samples may, in particular, be electrical test samples of an energy supply device. The individual test modules can be selected and combined in a user-specific manner, so that a sequential test specification is provided for the overall test to be carried out by the test system. In particular, the selection of the individual test modules is effected by a menu control via a graphical user interface.

A central test sample parameter memory makes available all data relating to the test sample or test samples to be tested. Further, a central test apparatus parameter memory is provided which makes available all data relating to test apparatuses, which data describes the test apparatuses connected to the test system. By checking the data stored in the test apparatus parameter memory the test system can thus automatically determine whether the test apparatuses available are sufficient for the user-specifically assembled test.

After a user has assembled a particular test sequence in accordance with his wishes, the test is carried out, whereby the individual test modules embedded in this user-specific test sequence are sequentially called up and activated and thus carry out their respective corresponding functional test. The results of the test are stored in a test report.

The test report or the test protocol is, in particular, embedded in the user-specific assemble test sequence or test specification and can be stored together with this test specification. By means of reloading this test specification there can, after deletion of all entered test results, be carried out a renewed test on the basis of an already assembled user-specific test specification. This means that on the one hand earlier test results can later be inspected once again and on the other hand on the basis of archived test results a similar test can be carried out again since together with the earlier test specification or the test report all parameter data necessary for the earlier test is stored.

Advantageously, the test modules selected by the user can be carried out not only in their totality, i.e. in accordance with their predetermined sequence, but can also be individually called up, which is helpful, in particular, for the seeking of an error after the appearance of an error during the overall test.

Individual functions of the test system can be protected by means of user-specific access codes, which as a rule are provided as passwords, so that for individual users only particular functions of the test system are accessible. For particular users there may, for example, be possible only the loading and viewing of a test report, without this user being able to carry out its own test or an alteration of the test report or the test specification. For other users, the possibility of macro-programming in the test system may be blocked.

The test system in accordance with the invention, and the test method in accordance with the invention, have numerous advantages in comparison with the known state of the art. Thus, in a simple manner, a complex overall test for a, for example, multi-functional test object can be assembled user specific, whereby the test sample can be tested in its entirety, i.e. all functional individual aspects can be tested within a test and further can be evaluated. For the purposes of carrying out a test, a test report is automatically produced which at the same time can be employed as a re-usable test specification for subsequent tests or checks. The production of the user-specific test specification is effected advantageously by way of a graphical user interface which is simple to operate. Checks already carried out can be archived so that test results can be followed historically. The automatically generated test report is represented with a special view so that a simple comparison with already carried out checks is possible.

BRIEF DESCRIPTION OF THE SEVERAL VIEWS OF THE DRAWINGS

The invention will be described below with reference to preferred exemplary embodiments and with reference to the drawings.

DETAILED DESCRIPTION

Figure 1:
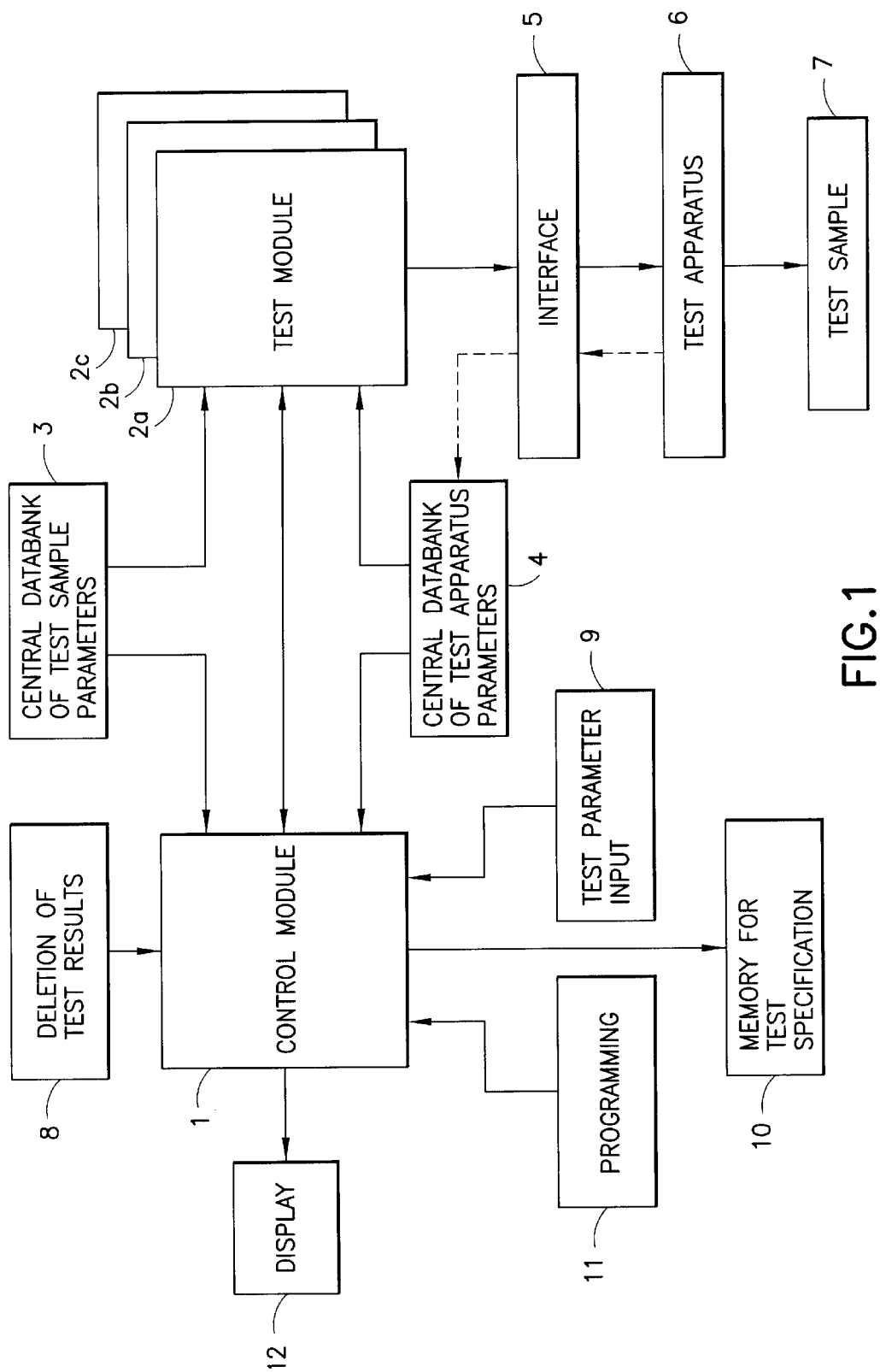
FIG. 1 shows a simplified block circuit diagram of a preferred exemplary embodiment of the test system in accordance with the invention.

FIG. 1 shows a simplified block circuit diagram of a preferred exemplary embodiment of the test system in accordance with the invention, which makes available an automatic testing or checking of one or more test samples with integrated protocolling/reporting and archiving of the test results.

The test system shown in FIG. 1 includes, as significant components, a control module 1 and a plurality of different test modules 2a–2c. The test modules 2a–2c each serve for the control of the same or different test apparatuses. In FIG. 1 only one test apparatus 6 is illustrated, which is controlled via a corresponding driver interface 5 by the individual test modules 2a–2c. The individual test modules 2a–2c may, for example, test different functions of one and the same test sample 7 or different functions of different test samples.

A central databank 3 serves for the storing and the overall administration over test modules of all test sample related data. Each object to be checked, i.e. each test sample 7, is modelled, i.e. is described by means of a plurality of different test sample parameters which are stored in the databank 3. Thereby, there may be initially present only the test sample related data actually necessary for the checking or testing, however the extent of the data can correspondingly later grow dynamically. In the case of test samples of energy supply devices there may be involved, for example, an over-current relay or an energy meter. Further, the test sample 7 may be a synchronization device which is necessary upon the switching in of a generator to a supply network, in order to match the voltage and the phase disposition of the generator to the supply network. Further, a multi-functional test sample may be involved, such as e.g. a multi-functional branch protector which by means of monitoring the current or the impedance of a branch line of a supply network can selectively switch off the branch line. The test sample related parameters stored in the central databank 3 can thus, for example, describe the inputs or outputs (analog or digital) of the test sample to be tested, and the functions thereof. In particular the test sample related parameters may relate to individual characteristics, nominal current or voltage values or the environment, in terms of circuitry technology, of the test sample, such as e.g. the control of the test sample by means of a transformer etc. The test sample related parameter data of the databank 3 must, before the carrying out of a test, be indicated by a user to the test system, i.e. must be input, whereby advantageously this input is effected separately for the individual test modules 2a–2c, in particular, upon their incorporation in the test specification. Since this test sample parameter data is preferably stored in a file having an open, documented format, it is also possible to exchange the test sample parameter data by means of software, whereby, for example, a manufacturer of a particular test sample stores in advance all necessary parameter data for the corresponding test sample in a corresponding data file which can be taken up into the databank 3, so that the user need not enter the test sample parameter data once again. The control module 1 and also the individual test modules 2a–2c access the test sample parameter data stored in the databank 3, since this data is necessary, in particular, for the carrying out of the individual test modules and thus for the control of the test apparatus 6.

Further, there is provided a second central databank 4 for the storage and overall administration over test modules of test apparatus related data. Each connectable test apparatus 6 is modelled in its entirety, i.e. data describing the individual parameters of this test apparatus 6 is administered centrally in the databank 4. The test apparatus parameters stored in the databank 4 relate to all physical characteristics of the individual test apparatuses, such as for example current or voltage amplitudes, the numbers of measurement inputs and outputs or the memory region available on each test apparatus. In particular, the test apparatus parameters define the type of the individual test apparatuses and indicate whether, for example, additional amplifiers or other apparatuses are connected with the test apparatuses. The test apparatus parameters stored in the databank 4 are available both to the control module 1 and also the individual test modules 2a–2c, since this data also is necessary for the carrying out of the individual test modules and for the control of the individual test apparatuses via the interface 5.

The databanks 3 and 4 may also be realised by means of a central data administration.

As already described above, it is proposed in accordance with the invention to generate a test sequence or a test specification by means of user-specific selection and combination of the individual test modules 2a–2c. After this test specification has been generated, the control module 1 controls the individual test modules 2a–2c specifically in accordance with the test specification 13 produced in accordance with the wishes of the user and activates the test modules so that the individual test modules 2a–2c carry out sequential partial tests with regard to a test sample 7 or different test samples.

In accordance with a preferred configuration of the present invention it is further proposed that before carrying out an overall test, there be carried out a checking of the performability of the overall test. This is effected in that before activation of the individual test modules 2a–2c in accordance with the user-specific test specification or test sequence, the control module 1 compares the requirements of the test modules selected by the user for his test procedure with the actually available, i.e., connected to the test system, test apparatuses. This is effected, in particular, in that the control module 1 accesses the test apparatus parameter data stored in the databank 4. When the test system is put into operation, the test system automatically queries via the interface 5 all connected test apparatuses 6 and their test apparatus parameter data and stores the test apparatus parameter data corresponding to the test apparatuses 6 recognized as being connected in the databank 4, so that the databank 4 always contains the test apparatus parameter data of all available test apparatuses 6 before the carrying out of a test. By means of access of the data stored in the databank 4 the control module 1 can consequently, in connection with the test modules 2a–2c, decide whether the test modules 2a–2c referred to in the user-specific test specification can be carried out with the test apparatuses identified as being connected by means of the data stored in the databank 4. If this is not possible, the control module 1 issues a corresponding warning, acoustically or optically, via an indicator device 12. Additionally, the control module can optically illustrate the test apparatuses necessary for the carrying out of the test via the indicator 12, so that, for example, the necessary cabling or wiring of the individual test apparatuses 6 necessary for the carrying out of the test can be shown, in order to facilitate for a user the correct carrying out of the overall test which he has user-specific assembled.

With the aid of the above-described checking of the availability of the necessary test apparatuses it is ensured that, in the case that the necessary test apparatuses are not connected to the test system, appropriate steps can be taken before a test—(which may in some circumstances take considerable time)—and not for the first time during the running of the test when a corresponding error report is issued.

Figure 2A:
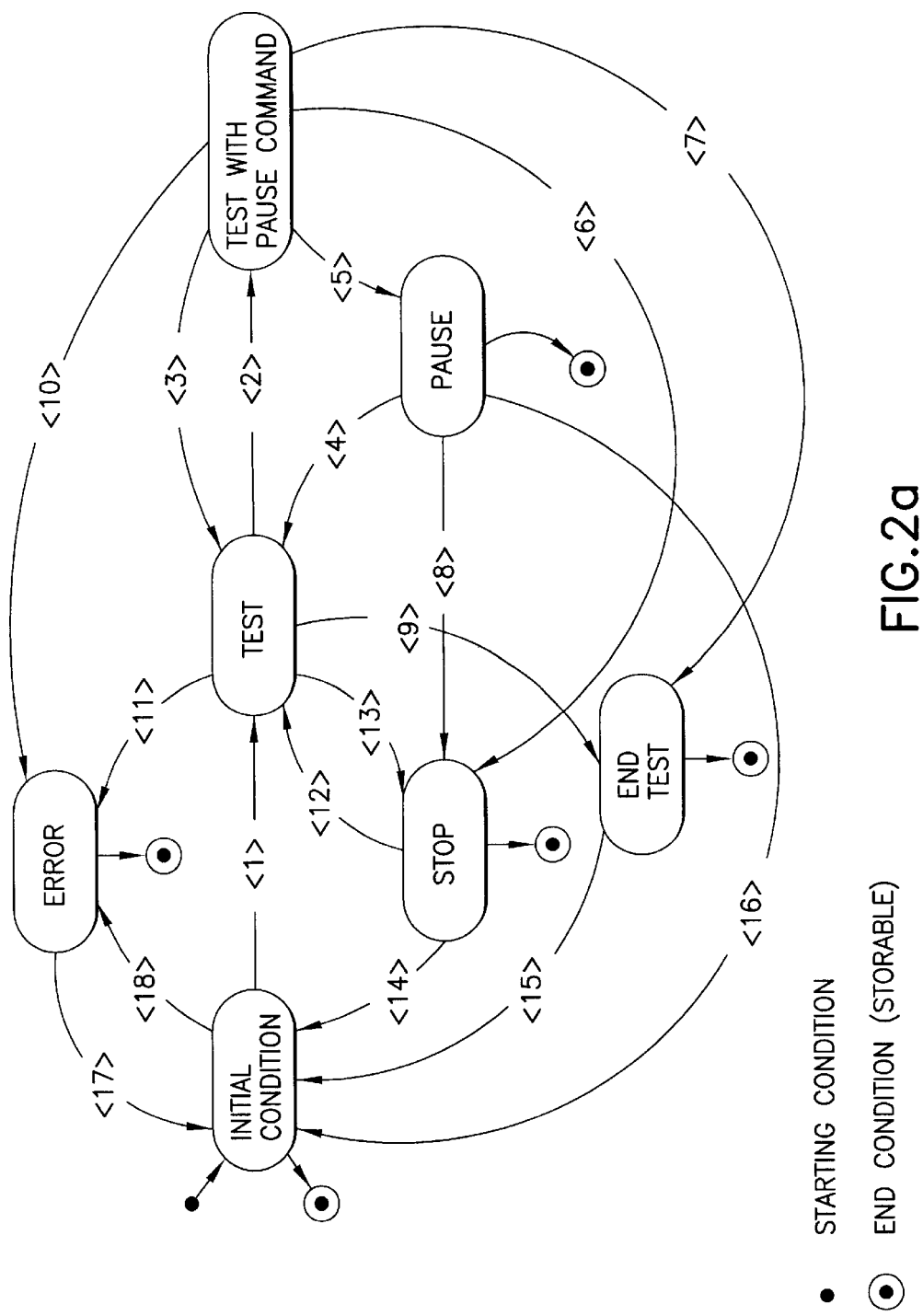
FIGS. 2a and 2b show condition transitions occurring in the preferred exemplary embodiment illustrated in FIG. 1.

In order to ensure performance of the overall test independently of the control module 1, condition control is employed which is realised both in the control module 1 and also in the individual test modules 2a–2c. FIG. 2a shows individually occurring conditions and the allowed condition transitions whereby a corresponding indication to the control module 1 is associated with each condition transition, so that the control module 1 is continuously informed about the condition or the progress of the test and can issue corresponding condition reports.

As is shown in FIG. 2a, starting from the "initial condition" a transition to the condition "test" (condition transition <1>) is effected by means of the control of the individual test modules with the aid of the control module. The test procedure can be halted or broken off by the user. If the test procedure is merely halted by the user (condition transition <2>), the test system concludes the current test step and then goes into the "pause condition" (condition transition <5>). The test procedure then can be resumed (condition transition <4>) If, on the other hand, the test procedure is broken off by the user (condition transition <13>), the test procedure is immediately broken off and terminated ("stop condition"). A broken off test can also be again resumed by the user (condition transition <12>). If a test procedure is merely halted by the user, from this condition the test can also be broken off and immediately terminated (condition transitions <6> and <8>). The condition transition <8> can also be omitted. If the test sequence can be completely carried through, transition into the condition "test ended" takes place (condition transition <7> and <9>). If, in contrast, an initial condition or, during the testing, an error arises in the system, by means of the condition transitions <18>, <11> and <10>, a error handling procedure is carried out. Starting from the individual conditions illustrated in FIG. 2a, the user can effect a transition again into the "initial condition" (condition transitions <14>, <15>, <16> and <17>), whereby in each case a deletion of the current test results is involved.

Figure 2B:
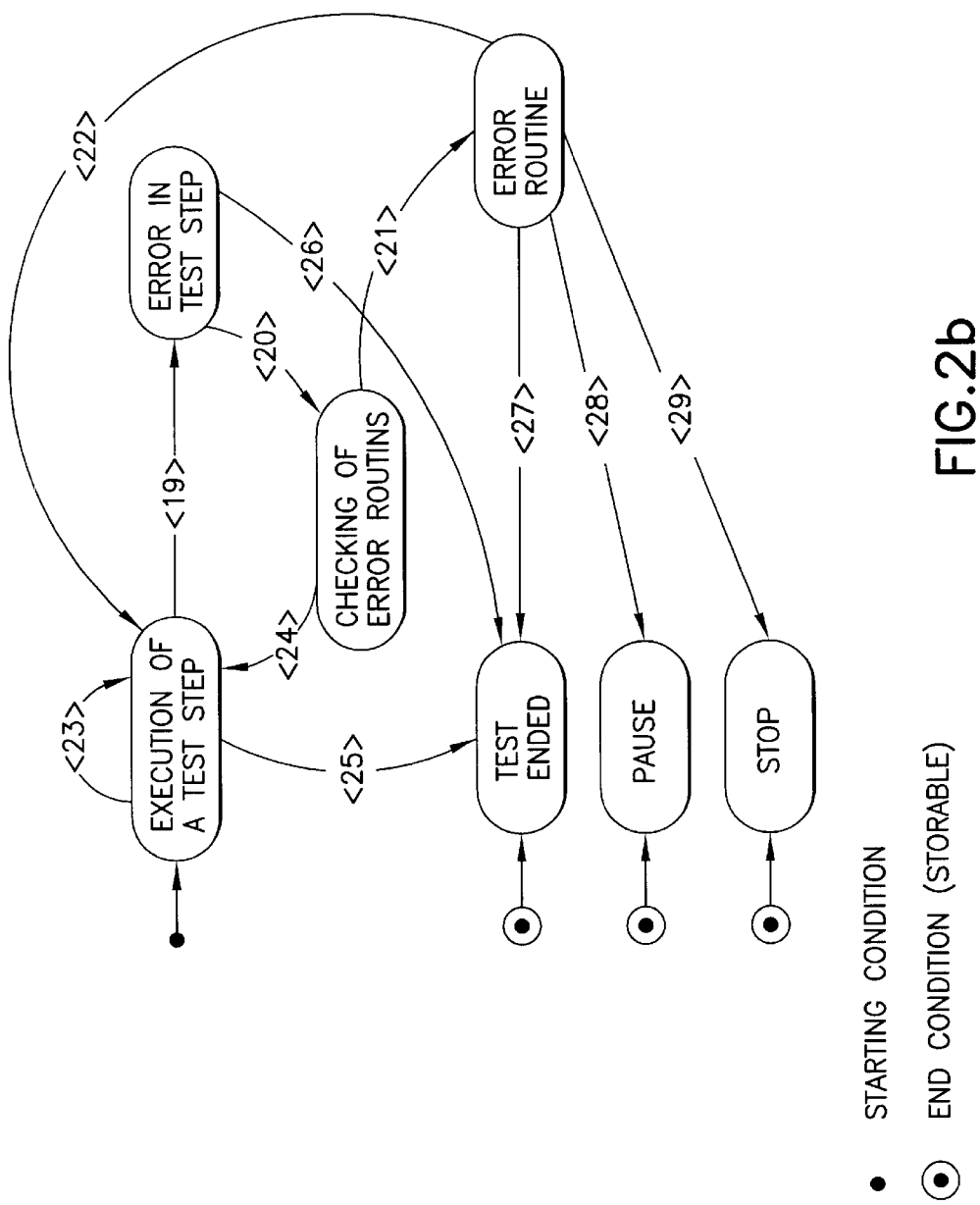

With reference to FIG. 2b, described below is how errors handled during the testing. As has already been mentioned, there is carried continuously an evaluation of the partial results of the test, whereby in the case of an error free partial result the test is continued (condition transition <23>) and in the case of an erroneous partial result a transition into error handling takes place (condition transition <19>). By means of the condition transition <26>, the user can decide after the appearance of an error, for example to save time, that he wishes to immediately terminate the test. Otherwise, it is checked whether an error routine is installed (condition transition <20>) and—, if not—then again continued with the test condition (condition transition <24>). If, on the other hand, an error routine is installed (condition transition <21>), the user can within this error routine himself determine the further carrying out of the test. The user can determine that the test should be continued normally (condition transition <22>), that the test should be halted (condition transition <28>) or that the test should be immediate broken off (condition transition <29>), in order, for example, to continue the test later when more detailed investigations with regard to the cause of the error are carried out. Likewise, the user can also determine that despite the appearance of an error the test is to be regarded as completed (condition transition <27>), because, for example, the end result of the test is already determined or the user wishes to evaluate a test as "error free" despite the appearance of an error. By means of the condition transition <25> it is finally automatically recognized that the test step carried out is the last test step of the overall test, so that a transition takes place into the condition "test ended".

In the condition diagrams illustrated in FIG. 2a and FIG. 2b a difference is made with regard to the individual conditions between initial conditions (illustrated by means of a filled black circle) and end conditions (illustrated by means of a filled black circle surrounded by a circular line). If the test system is in one of the end conditions there can be stored the results of the test, and the test specification generated by the user, together with all parameters necessary for the test.

Because of the condition control illustrated in FIG. 2a and 2b it is ensured that the control module 1 is continuously informed about the progress and the condition of the test, so that corresponding condition reports can be issued by the control module 1 in order to inform the user appropriately.

Below, with reference to FIG. 1, the generation of a test specification in accordance with the test method according to the invention will be explained in more detail.

After putting the test system into operation, at the beginning the control module 1 is started and there is produced from the control module 1 initially an empty test specification, i.e. a test document which is not yet filled out, and this is represented on a screen serving as a display device 12. The user can, via appropriate input means 9, for example, a keyboard or a mouse, enter into this test specification any desired text and can format or edit the test specification. Likewise, other standard objects, such as, for example, ActiveX objects (graphics, tables) can be used as desired. Individual test modules, i.e. partial tests, are selected by the user in the desired sequence and in this manner sequentially inserted into the test specification produced by the control module 1. Between the individual test modules there may be input or embedded a desired text or commentary. With the selection of a test module 2a–2c, a test report or test protocol made available by the inserted test module is automatically inserted by the control module 1 at the appropriate location in the test document. This test report initially contains no results. At the same time, with the insertion of a test module 2a–2c, the input of test parameters via the input device 9 is made possible. These test parameters are to be user-specific entered for each test module and determine the test sequence such as for example, individual points to be tested. The test parameters may, for example, be entered by means of the automatic opening of a corresponding input mask. At this point the user can also enter further test sample parameters, in order to supplement the contents of the central test sample parameter administration 3.

After a test specification or a test document with several test modules 2a–2c, arranged in a desired sequence, has been produced in this manner by the user, the user can start the test via the control module 1, whereby both the overall test and also a particular individual test module can be carried out. In particular, before the start of the test, the user can select in a simple manner the test modules in the test specification which he produced which are actually to be carried out. The test results are automatically displayed on the display device 12 and can further be printed out. Further, the test results are taken up automatically by the control module 1 into the test document, i.e. into the test specification, produced by the user, so that the user can store or place the entire test specification together with the test results in appropriate memory means 10, for example in a databank.

A test once carried through can serve as a template for a new test or as a template for a renewed carrying through of the same test. For this purpose the user must merely load the older test specification stored in the memory medium 10 and delete—, if present,—the test results stored therein, via correspondingly provided deletion means 8. After deletion of the old test results the test specification is again available in its original form and can, in particular, be supplemented or altered by the user through selection of further test modules 2a–2c or through the deletion of already selected test modules. This method is particularly helpful for the comparison of individual tests with one another. The test last carried out by the user or loaded from the memory medium 10 is advantageously initially retained and is represented on the display device 12 alongside the test newly carried out by the user, so that the individual tests can be compared in a simple manner and, in particular, a trend in the test can be recognized.

As an aid for particularly complex procedures in the test system, the control module 1 and/or the individual test modules 2a–2c can be automated by means of a so-called macro-programming (Basic Scripting). This is effected by means of corresponding programming means 11, whereby the programming can, in particular, be effected and called up via a keyboard.

As already described with reference to FIGS. 2a and 2b, a user can start, stop or pause any desired test module by means of the control module 1. Further, by means of the deletion means 8, the user can reset already present test results, i.e. delete those results. Advantageously, before the carrying out of a new test, initially existing test results must be stored or deleted in order not to overwrite the existing test results in an unintended manner.

Figure 3:
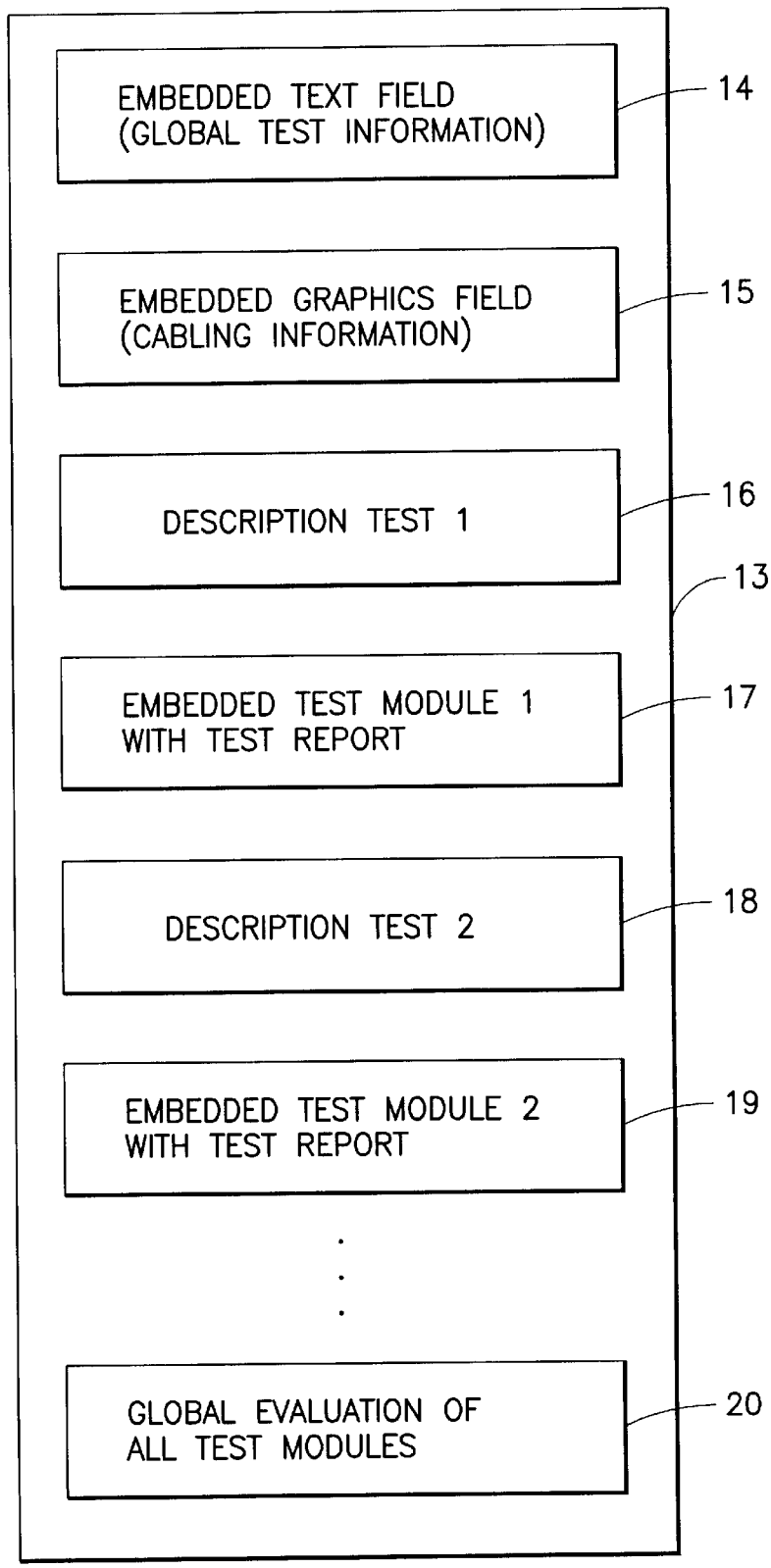
FIG. 3 shows by way of an example the make up of a test specification, in which test protocols are embedded, generated by the test system in accordance with the invention.

FIG. 3 shows an example for a test specification 13 produced by the user. The user has initially inserted into the test specification 13, i.e. the corresponding test document, a first text field 14 which, for example, may contain global test information concerning the identity of the user, the subject of the test, the date of the test etc. If, the user has embedded a graphics field 15, the control module 1 advantageously generates this graphics field 15 automatically and contains cabling or wiring information for the user with regard to the connections of his test apparatuses to the test sample. This graphics field 15 is, in particular, produced by the control module only after selection of individual test modules, whereby the selection of a test module is detected by the control module through access to the central databank 4 illustrated in FIG. 1 with the there stored test apparatus parameter data, so that the necessary cabling or wiring of the corresponding test apparatus is determined and shown in the graphics field 15. Then, the user may input a further text 16 which, for example, serves as the title and definition of the following first test module 17 selected by the user. After selection of the first test module 17, this is automatically embedded in the test specification 13 by the control module and reproduced in the form of a test protocol or report in the test specification 13, whereby the user can determine the extent of the representation of this test protocol. In this manner, the user can determine which test results of the corresponding test module are of actual interest to him. In similar manner, there can be inserted further test titles 18 and further test modules 19. At the end of the test specification there is automatically generated and inserted by the control module an overall statistical information 20, i.e. a global evaluation of all test modules 17 and 19 embedded by the user, which, for example, contains information about the number of inserted test modules, the number of tested test modules, the number of error free test modules and the number of erroneous test modules. Advantageously, for example, before the cabling information 15, there can be inserted also an information field concerning the test sample parameters of the test from the central test sample parameter administration.

In this way, with the aid of the test system in accordance with the invention, a complex test process can be simply produced by a user in accordance with his own individual requirements, and a global overall evaluation of the overall test determined by the user can be determined.

The test specification illustrated by way of example in FIG. 3 can—(as has already been described)—be stored by the user, whereby together with the test specification the test results possibly contained within the individual test protocols or reports and the test modules embedded in the test specification can be stored together with the test specification. Further, there are advantageously stored together with the test specification 13 the test parameters for the individual embedded test modules and advantageously also the test sample parameters and test apparatus parameters for the carrying out of the embedded test modules, read out of the databanks 3 and 4, so that after loading of the test specification 13 the same test can be repeated without problem. Before carrying out the same test, however, via the deletion means 8, the last determined test results should be deleted. Since in the interim, there may also be other or new test apparatuses connected to the test system, the databank 4, which contains all test apparatus parameters of test apparatuses connected to the test system, is constantly actualised, i.e. the test apparatuses 6 connected to the interface 5 are constantly checked and the corresponding test apparatus parameters stored in the databank 4. Upon starting of a new test, the test modules can then access, in each case, the current test apparatus parameters.

The principle upon which the present invention is based has been explained above in general with reference to FIGS. 1 to 3 and with reference to an arbitrary test sample 7, whereby the test sample may be in particular a multi-functional electrical test sample which thus makes available a plurality of functions.

Preferably, however, the present invention is employed for the testing of the operability of energy supply devices or their components. Further, the test system in accordance with the invention or the test method in accordance with the invention is preferably realised in a computer-aided manner, whereby the user can communicate with the test system advantageously by menu control via a graphical user interface.

Below, there will therefore be described, with reference to FIGS. 4 and 5 a preferred exemplary embodiment of the present invention with reference to a graphical user interface which has been developed for the 32-bit operating system MICROSOFT WINDOWS 95™ or MICROSOFT WINDOWS NT™ and which is based upon a Microsoft ActiveX/OLE implementation.

First, the user interface possesses a menu bar 21, which makes available the usual menu commands for Windows applications. In particular, via this menu bar, test specifications or test documents already produced can be stored, loaded, printed, newly produced, edited, formatted, etc. Via the menu selection "insert", a new test module can be inserted into a test specification, whilst via the menu selection "test" the test in accordance with the produced test specification can be started, halted, broken off, or continued. Likewise, via this menu selection, certain test results can be deleted. Via the menu selection "script" the already-mentioned macro programming can be carried through, whilst via the menu selection "view" switching between different views, for example a so-called icon view or a list view of the embedded test modules can take place. Via the menu point "Windows" or "Help", the represented windows can be arranged or a help function can be called.

Beneath the menu bar 21 there are represented buttons for the more significant above-described menu commands, which thus make possible a simplified access to the important menu commands. Further, therebelow, there are represented setting fields or formatting buttons 23 which in particular serve for the formatting of an input text or of an embedded graphic.

The control module dynamically monitors all available test modules which, in particular, are stored in the system in the form of a databank. The available test modules are continuously displayed in a field 29. In this manner new test modules can be selectively added, which are then automatically recognized and immediately made available to the user via the field 29.

The field 25 represents the test specification produced by the user or the test document produced by the user. The user can enter any desired text into this field or can embed graphics, and can produce links to other standard data files. A test module is selected out of the test module region 29 in that a symbol corresponding to the test module is clicked on with the mouse pointer and inserted into the field 25 at the present position of the cursor. The test module is then immediately represented in the form of a corresponding protocol/report view which shows the (initially not present) test results of the corresponding test module and, if applicable, also the corresponding test apparatus and test sample parameter information.

Above the actual test specification field 25, a further field or window 24 is opened which represents in list form all of the text modules thus far selected by the user, whereby the individual test modules can be activated and selected for a following test by means of the check boxes.

In the list field 24, there are represented the selected test modules together with the current status of the corresponding test module and information concerning the test apparatus configuration necessary for the corresponding test module.

Figures 4, 4A:
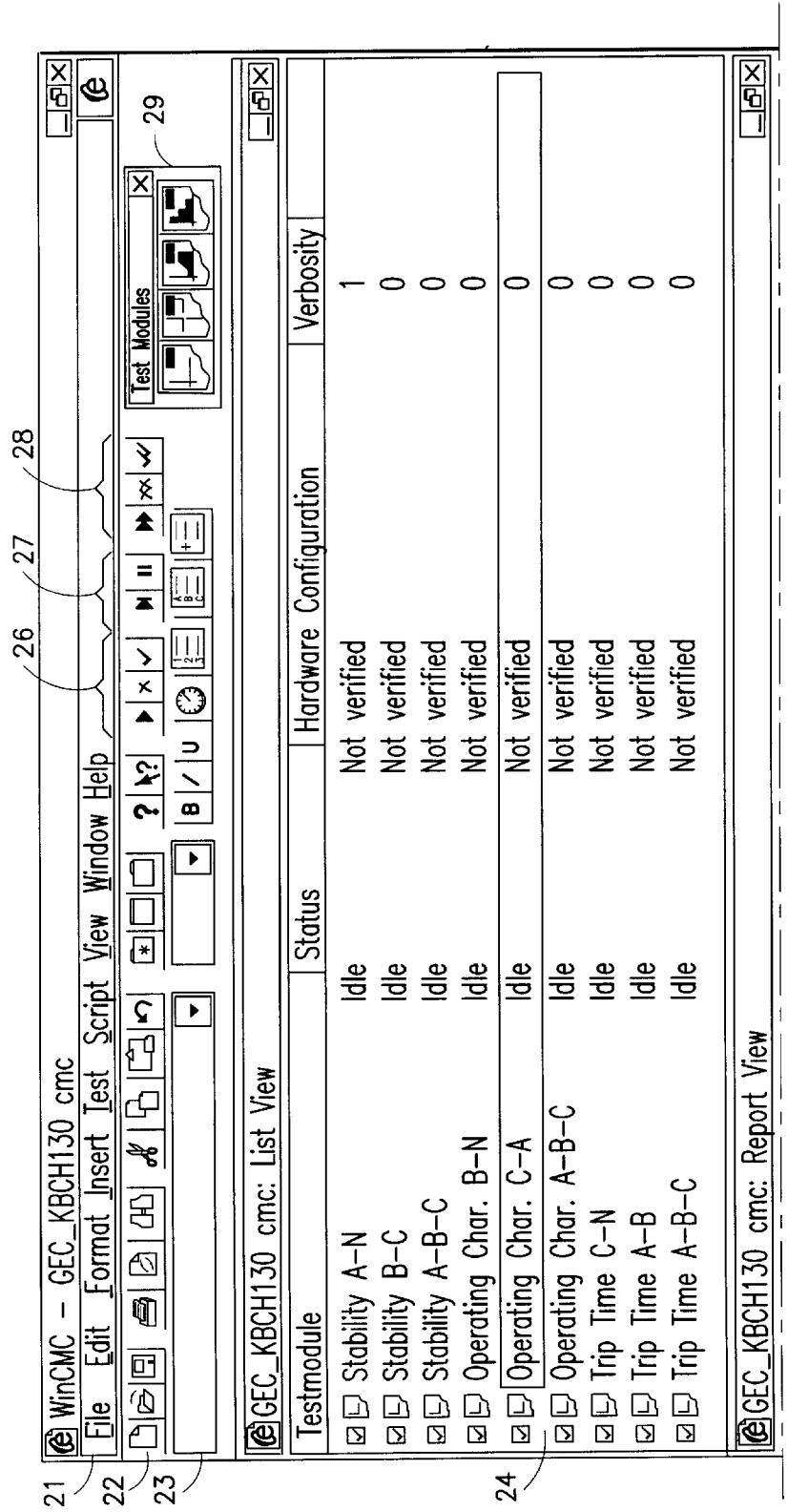
FIG. 4 shows an exemplary embodiment of a graphical user interface employed with the preferred exemplary embodiment.

In the upper region of the graphical user interface shown in FIG. 4 there are represented buttons 26 via which a particular test module, which is represented highlighted in list field 24, can be individually started and via which the test results corresponding to this test module can be deleted and the test apparatus configuration necessary for the carrying out of this test module can be checked, i.e. verified.

Alongside there are represented buttons with which both an individually running test module and the overall test can be interrupted or halted.

Finally, buttons 28 are also represented by means of which a test of all embedded test modules in the sequence selected by the user, a deletion of all test results, and a checking of the test apparatus configuration necessary for all test modules, is possible.

As has been described above, after selection of a new test module from the test module region 29, an input mask is automatically opened which makes possible a setting of the test parameters necessary for the carrying out of the corresponding test module. This condition is represented in FIG. 5.

Figure 5A:
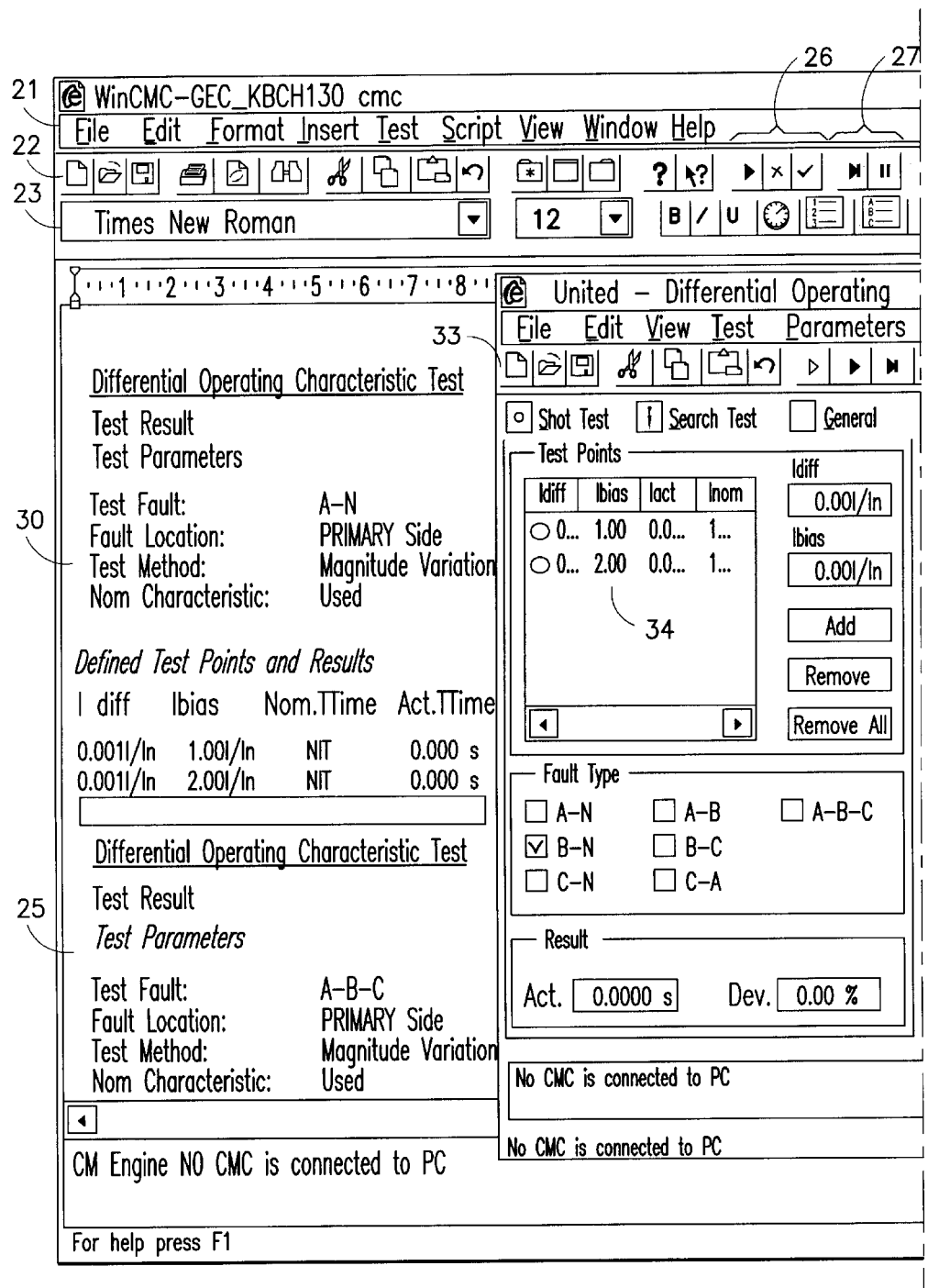
FIG. 5 shows a further illustration of the graphical user interface shown in FIG. 4.
Figure 5B:
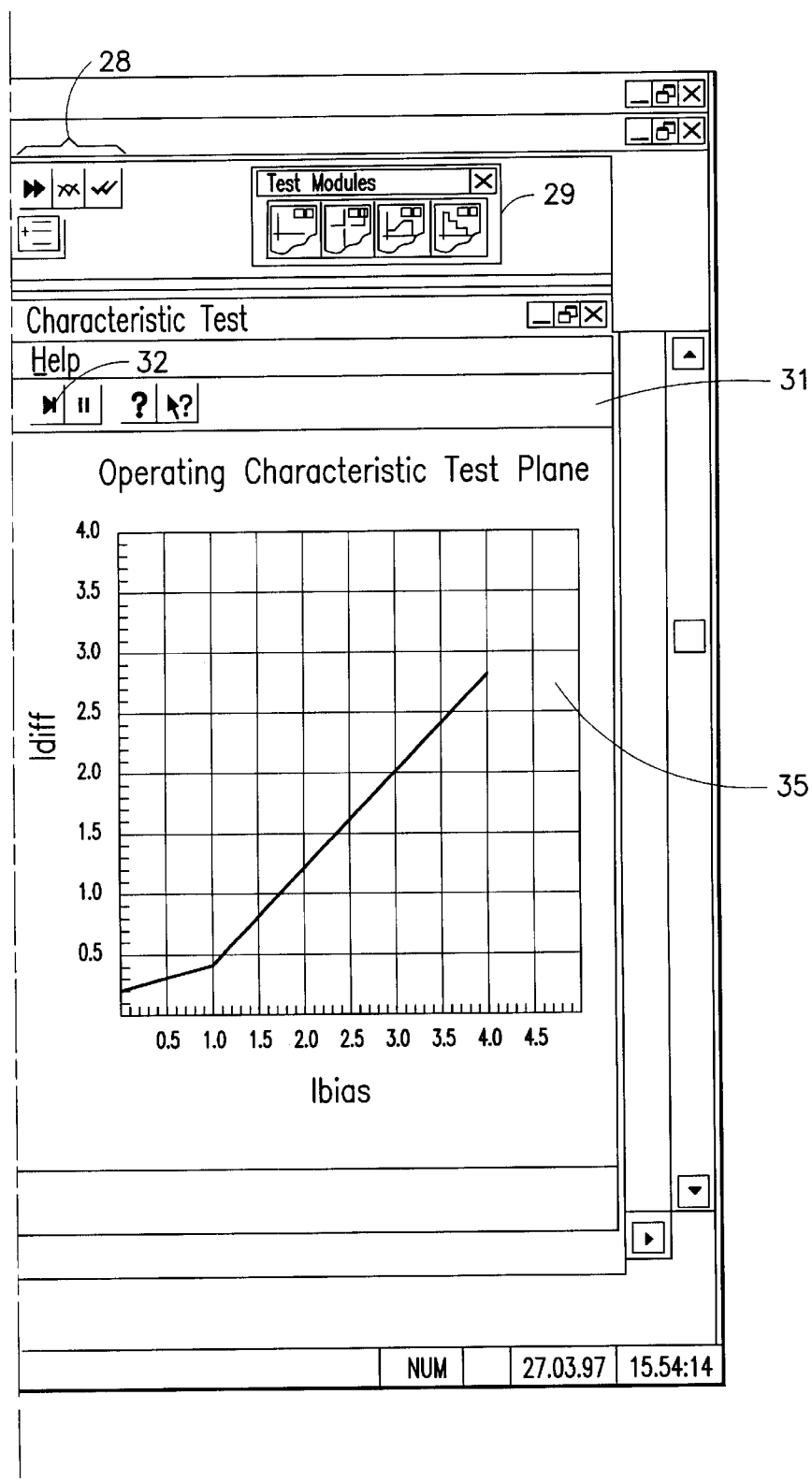

The input mask 31 represented in FIG. 5 in turn contains a menu bar via which the individual properties of the test module can be loaded or altered. The main menu selections are again assembled in a button bar 33. Further, this input mask contains buttons 32 via which the individual test modules can be individually, i.e. separately from the overall test, carried out and broken off or halted. Further, via one of these buttons, the test results of the corresponding test module can be deleted. Furthermore, it is possible to carry out a test module without the production of a test or check report, which is particularly helpful for seeking errors.

In a field 35 of the input mask 31 there is represented the test module's own characteristic relationship between the differential current and the stabilisation current for an electrical test sample of a energy supply device. The user now has the possibility, by clicking on any desired point within the characteristic field 35, to select the corresponding point as the test point for the carrying out of the test module, whereby the corresponding test point is taken into a display field 34. By means of the buttons represented alongside this display field, individual or all test points can again be removed. Beneath the display field, the kind of test can be determined for the test to be carried out by means of the test module, whereby, for example, a three-phase system can be checked, the three phases being abbreviated as A, B and C and earth as N. By selection of the field "B-N", there is thus correspondingly checked for error between the second phase and earth. Therebelow, with regard to a selected test point, there is reproduced the actually measured response time and the deviation yielded thereby.

In the display field 34 there is further displayed for each selected test point, after carrying out of a test, the measured response time "$t_{act}$" and the desired response time "$t_{norm}$".

Both in FIG. 4 and also in FIG. 5 buttons which are not available for the user, e.g. the test button before storing or deleting existing test results, are represented grayed out.

Within the input mask 31 switching can take place between different views for the input of different test parameters for the selected test module. Further, it is also possible to switch between the input mask 31 represented in FIG. 5 and the test report view likewise represented in FIG. 5, whereby the test report field 25 with the actual test specification is preferably constantly represented in the background. The test module currently being edited via the input mask 31 is represented highlighted within the test specification 25 (as indicated by the reference sign 30).

What is claimed is:

1. Test system for testing the operability of test samples and a test report on the test results of individual tests, comprising having at least two different test modules (2a–2c), which each test different operating functions of one and the same test sample or of different test samples connected to the test system, having input means for producing a user-specific test specification by means of a user-specific selection and combination of individual test modules, and having a control module which controls and, thus, sequentially activates the test modules in accordance with the user-specific test specification and, upon carrying out the user-specific test specification and activation of the test modules, automatically produces a test report on the test results of the individual tests of the test modules controlled in accordance with the test specification.

2. Test system according to claim 1 characterized in that, the production of the user-specific test specification (13) is effected computer-aided via a graphical user interface.

3. Test system according to claim 1, characterized in that, the control module (1) automatically detects and displays all available test modules (2a–2c).

4. Test system according to claim 1, characterized in that, standard objects (14, 15, 16, 18) of particular data formats can be embedded into the user-specific test specification.

5. Test system according to claim 4, characterised in that, the embeddable standard objects are texts (14, 16, 18), graphics (15) and/or data files.

6. Test system according to claim 1, characterized by, programming means (11) for user-specifically automating particular procedures of the control module (1) or of a test module (2a–2c).

7. Test system according to claim 1, characterised in that, the control module (1) automatically inserts the test report into the user-specific test specification (13).

8. Test system according to claim 7, characterised by, deletion means (8), for deleting individual or all test results within a test specification (13).

9. Method for testing the operability of test samples, comprising the steps:
   (a) making available a plurality of different test modules which respectively test an electrical test sample with regard to a particular operating function of the test sample,
   (b) selection of particular test modules from the available test modules,
   (c) production of a sequential test specification for a user-specific test by means of combination of the particular test modules selected in step (b),
   (d) testing a test sample or different test samples in accordance with the sequential test specification produced in step (c), and
   (e) producing automatically a test report on the test results of the individual tests of the test modules included in the test specification, wherein the particular test modules are selected in step (b) such that different operating functions of one and the same test sample or of different test samples are tested in step (d).

10. Method according to claim 9, characterized in that, in step (b) a selected test module (17, 19) is automatically inserted into an existing test specification (13).

11. Method according to claim 10 or 9, characterized in that, after selection of a particular test module (17, 19) for the test specification (13), the test parameters for the selected test module are set.

12. Method according to any of claim 10 or 9, characterized in that, after step (d), a test report of the test results of the user-specific test is automatically produced.

13. Test system according to claim 1, characterized in that the test system includes a central test sample parameter memory means (3) for storing and administering data relating to test samples, which data describes the properties of the test samples (7) to be tested and which data in the memory means (3) may be accessed by the control modules and/or the test modules (2a–2c).

14. Test system according to any of claims 1, 2, 3, 4, 5, or 6 characterized in that the test system includes a central test apparatus parameter memory means (4) for the storage and administration of data related to test apparatuses, which data describes properties of test apparatuses (6) controlled by means of the test modules (2a–2c), which test apparatuses are provided for the testing of the test sample (7) or test samples, and which data in the memory means (4), may be accessed by the control module (1) and/or the test modules (2a–2c).

15. Test system according to claim 13, characterized in that, the test sample related data can be entered and/or exchanged.

16. Method according to claim 9, and further including means for deleting the test results characterized in that the test specification (13) is stored together with the test report and all necessary parameters for the carrying out of the test modules (17, 19) selected by the test specification (13), and the test results are deleted after carrying out of the test modules and the test specification (13) is employed again for a new test.

17. Test system according to claim 1, characterized by, input means (9, 31) for inputting for the individual test modules (2a–2c), test parameters for the individual test of the corresponding test module (2a–2c).

18. Test system according to claim 17, characterized in that, the control module (1) automatically activates the input means (9, 31) after selection of a test module (2a–2c).

19. The test system of any one of claims 2–6, 15, 7–8, 18, and further wherein the test system tests the operability of the electrical components of the energy supply devices.

20. Test system according to any of claims 1, 2, 3, 4, 5, 6 or 15, characterized in that the test system includes a central test apparatus parameter memory means (4) for the storage and administration of data related to test apparatuses, which data describes properties of test apparatuses (6) controlled by means of the test modules (2a–2c), which test apparatuses are provided for the testing of the test sample or test samples (7) and which data on the memory means (4), may be accessed by the control module (1) and/or the test modules (2a–2c); and further the test apparatus related data is automatically generated upon bringing into operation of the test system by means of checking the test apparatuses (6) connected to the test system, and/or the data entered by a user.

21. Method for testing the operability of test samples and retesting by deletion of earlier test results, comprising the steps:
   (a) making available a plurality of different test modules (2a–2c) which respectively test an electrical test sample (7) with regard to a particular functional aspect,
   (b) selection of particular test modules (17, 19) from the available test modules (2a–2c),
   (c) production of a sequential test specification (13) for a user-specific test by means of combination of the particular test modules (17, 19) selected in step (b), (d) testing a test sample (7) in accordance with the sequential test specification (13) produced in step (c), (e) subsequentially to step (d), a test report of the test results of the user-specific test is automatically produced, (f) the test specification is stored together with the test report and all necessary parameters for the carrying out of the test modules selected by the test specification, and (g) after deletion of the test results, the test specification is again employed for a new test process.

22. Test system according to claims 1, 2, 3, 4, 5, 6 or 15, characterized in that the test system includes a central test apparatus parameter memory means (4) for the storage and administration of data related to test apparatuses, which data describes properties of test apparatuses (6) controlled by means of the test modules (2a–2c), which test apparatuses are provided for the testing of the test sample or test samples (7) and which data on the memory means (4), may be accessed by the control module (1) and/or the test modules (2a–2c); further the test apparatus related data is automatically generated upon bringing into operation of the test system by means of checking the test apparatuses (6) connected to the test system, and/or the data entered by a user; and still further that before the carrying out of the user-specific test specification (13) the test system determines on the basis of the test apparatus related data stored in the central test apparatus memory means (4) whether the test apparatuses (6) available are suitable for the carrying out of the test specification (13).

23. The test system of any one of claims 1, 2–6 or 15, characterized in that the test system includes a central test apparatus parameter memory means (4) for the storage and administration of data related to test apparatuses, which data describes properties of test apparatuses (6) controlled by means of the test modules (2a–2c), which test apparatuses are provided for the testing of the test sample or test samples (7), and which data in the memory means (4), may be accessed by the control module (1) and/or the test modules (2a–2c); further the test apparatus related data is automatically generated upon bringing into operation of the test system by means of checking the test apparatuses (6) connected to the system, and/or the data can be entered by a user; and still further wherein the test system tests the operability of the electrical components of the energy supply devices.

24. The test system of any one of claims 1, 2–6, or 15, characterized in that the test system includes a central test apparatus parameter memory means (4) for the storage and administration of data related to test apparatuses, which data describes properties of test apparatuses (6) controlled by means of the test modules (2a–2c), which test apparatuses are provided for the testing of the test sample or test samples (7), and which data in the memory means (4), may be accessed by the control module (1) and/or the test modules (2a–2c); further the test apparatus related data is automatically generated upon bringing into operation of the test system by means of checking the test apparatuses (6) connected to the system, and/or the data can be entered by a user; and before the carrying out of the user-specific test specification (13) the test system determines on the basis of the test apparatus memory means (4) whether the test apparatuses (6) available are suitable for the carrying out of the test specification (13), and still further wherein the test system tests the operability of the electrical components of the energy supply devices.

25. The test system according to claim 1 or 20, characterized in that after production of the user-specific test specification (13), the control module (1) displays information (15) concerning the cabling of the test system with the test sample (7) to be tested; and further wherein the test system tests the operability of the electrical components of the energy supply devices.

26. The test system according to claim 1 or 20, characterized by having memory means (10) for the storage of the user-specific test specification (13); and further wherein the test system tests the operability of the electrical components of the energy supply devices.

27. The test system according to claim 1 or 20, characterized in that the memory means (10) store the user-specific test specification (13) together with all parameter data necessary for the carrying out of the test; and further wherein the test system tests the operability of the electrical components of the energy supply devices.

28. The test system according to claim 1 or 20, characterized in that the control module (1) contains condition information of the test modules (2a–2c), which information describes the condition of the test modules (2a–2c) and reproduces the condition information by means of appropriate reproducing means (12); and further wherein the test system tests the operability of the electrical components of the energy supply devices.

29. The test system according to claim 1 or 20, characterized in that the test modules (2a–2c) can be accessed individually; and further wherein the test system tests the operability of the electrical components of the energy supply devices.

30. The test system according to claim 1 or 20 characterized in that particular functions of the control module (1) and/or of the test modules (2a–2c) are protected by a user-specific access code; and further wherein the test system tests the operability of the electrical components of the energy supply devices.

* * * * *